(12) United States Patent
Kang et al.

(10) Patent No.: US 7,443,095 B2
(45) Date of Patent: Oct. 28, 2008

(54) ORGANIC LIGHT EMITTING DISPLAY

(75) Inventors: Tae-Wook Kang, Suwon-si (KR); Mu-Hyun Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 272 days.

(21) Appl. No.: 11/019,643

(22) Filed: Dec. 23, 2004

(65) Prior Publication Data

US 2006/0082293 A1     Apr. 20, 2006

(30) Foreign Application Priority Data

Oct. 15, 2004     (KR) .................... 10-2004-0082849

(51) Int. Cl.
*H05B 33/00* (2006.01)

(52) U.S. Cl. .................... 313/504; 313/506

(58) Field of Classification Search .......... 313/501–512
See application file for complete search history.

(56) References Cited

U.S. PATENT DOCUMENTS

| | | | |
|---|---|---|---|
| 5,998,085 | A | 12/1999 | Isberg et al. |
| 6,114,088 | A | 9/2000 | Wolk et al. |
| 6,214,520 | B1 | 4/2001 | Wolk et al. |
| 6,768,260 | B2 * | 7/2004 | Fukunaga et al. .......... 313/506 |
| 7,015,501 | B2 * | 3/2006 | Redecker et al. .......... 257/40 |
| 7,030,553 | B2 * | 4/2006 | Winters et al. .......... 313/504 |
| 7,109,650 | B2 * | 9/2006 | Park et al. .......... 313/504 |
| 7,138,764 | B2 * | 11/2006 | Koyama et al. .......... 313/506 |
| 2005/0077814 | A1 * | 4/2005 | Koo et al. .......... 313/500 |

FOREIGN PATENT DOCUMENTS

| | | |
|---|---|---|
| CN | 1307442 A | 8/2001 |
| CN | 1522099 A | 8/2004 |
| JP | 2003-264082 | 9/2003 |
| KR | 1998-51844 | 11/1984 |

OTHER PUBLICATIONS

Office action issued on Mar. 7, 2008 by the Chinese Patent Office in Chinese Patent Application No. 2004100997577 which corresponds to U.S. Appl. No. 11/019,643, and its English language translation.

\* cited by examiner

*Primary Examiner*—Ashok Patel
(74) *Attorney, Agent, or Firm*—Robert E. Bushnell, Esq.

(57) ABSTRACT

An organic light emitting display is provided with a height of a pixel defining layer formed on a planarization layer in a region where a first electrode is not formed, being formed to be lower than or equal to that of the pixel defining layer formed on the first electrode. In the process of forming the organic layer pattern, a distance between a donor substrate laminated on a substrate and the first electrode is minimized to allow the transfer to be performed with a low energy of laser beam. Accordingly, it is possible to improve energy efficiency of the laser beam. With this process, it is possible to improve efficiency and the lifetime of the device because the transfer energy is low.

16 Claims, 6 Drawing Sheets

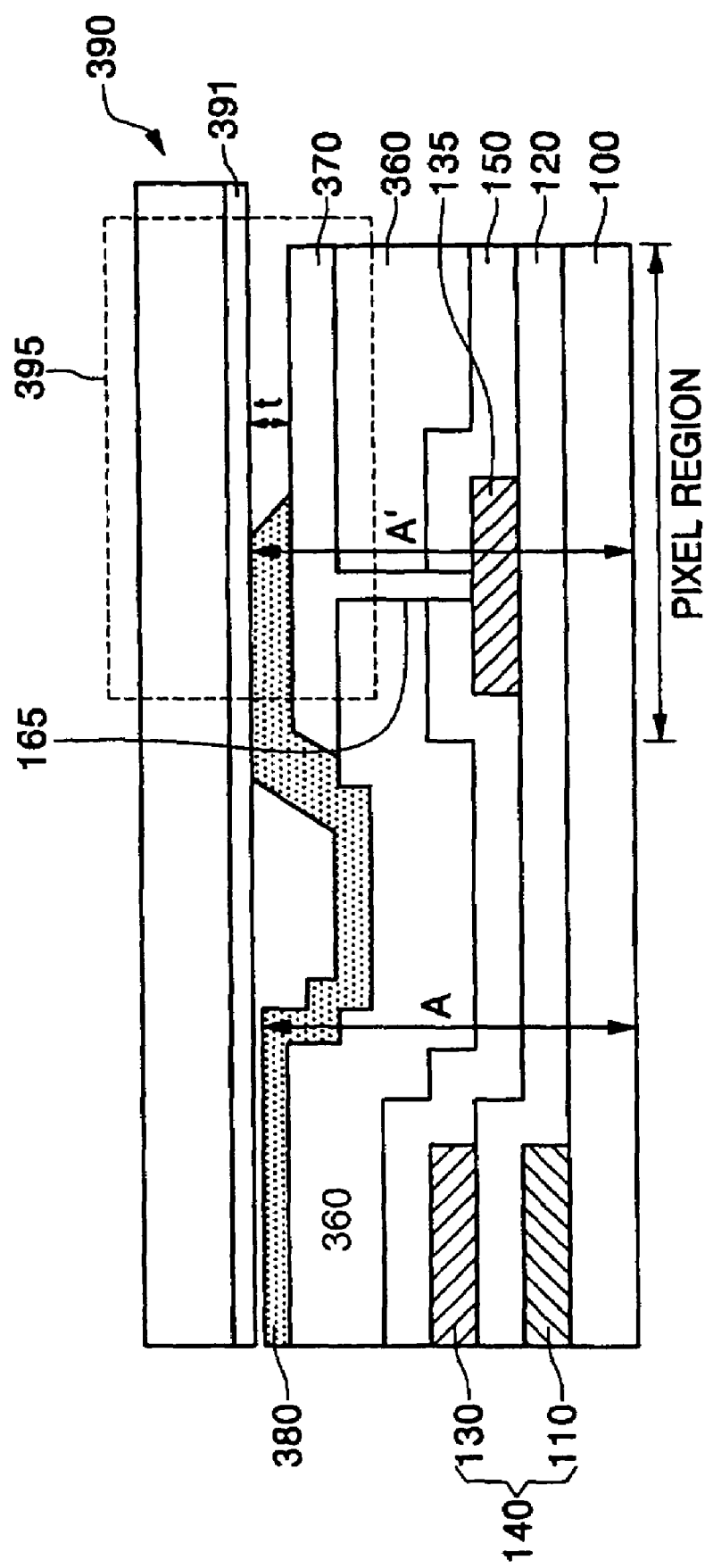

ORGANIC LIGHT EMITTING DISPLAY

CLAIM OF PRIORITY

This application makes reference to, incorporates the same herein, and claims all benefits accruing under 35 U.S.C. §119 from an application earlier filed in the Korean Intellectual Property Office on 15 Oct. 2004 and there duly assigned Ser. No. 2004-82849.

BACKGROUND OF THE INVENTION

1. Field of the Invention

The present invention relates to organic light emitting displays and manufacturing processes generally and, more particularly, to an organic light emitting display and process in which a pixel defining layer formed on a planarization layer in a region where no first electrode has been formed, is formed with a height that is either lower than, or equal to, that of a pixel defining layer formed on the first electrode.

2. Description of the Related Art

In general, an organic light emitting display manufactured as a flat panel display device is composed of an anode, a cathode, and organic thin layers interposed between the anode and the cathode. The organic thin layers include at least an emission layer, and may further include a hole injection layer, a hole transport layer, an electron transport layer, an electron injection layer, and so forth, exclusive of the emission layer. This organic light emitting display is divided into two types according to the material constituting the organic thin layers, particularly the emission layer: a first type organic light emitting display which uses a polymer organic light emitting display, and a second type of organic light emitting display that uses a small molecule organic light emitting display.

In order to realize full color in the organic light emitting display, the emission layer should be patterned. There are two methods for patterning the emission layer: one method uses a shadow mask when patterning a small molecule organic light emitting display, and the other method uses either an inkjet printing technique or a laser induced thermal imaging (LITI) technique when patterning a polymer organic light emitting display. Among these techniques, the LITI method has the advantages of being capable of precisely patterning the organic layer and being suitable for patterning a large-sized display with a high degree of resolution, and has the advantage of being a dry process, while the inkjet printing technique is a wet process.

The technique of pattering the organic thin layer by the LITI technique requires at least a light source, a substrate for the organic light emitting display, and a donor substrate. Patterning the organic layer on the substrate is performed in such a manner that light emitted from the light source is absorbed into a light-to-heat conversion layer of the donor substrate to be converted into thermal energy, and then a material forming a transfer layer is transferred to the substrate by the thermal energy. This technique is disclosed in Korean Patent Application Publication No. 1998-51844 and in U.S. Pat. No. 5,998,085 to Isberg et al., entitled *PROCESS FOR PREPARING HIGH RESOLUTION EMISSIVE ARRAYS AND CORRESPONDING ARTICLES*, issued on Dec. 7, 1999; U.S. Pat. No. 6,214,520 to Wolk et al., entitled *THERMAL TRANSFER ELEMENT FOR FORMING MULTI-LAYER DEVICES*, issued on Apr. 10, 2001; and U.S. Pat. No. 6,114,088 to Wolk et al., entitled *THERMAL TRANSFER ELEMENT FOR FORMING MULTILAYER DEVICES*, issued on Sep. 5, 2000.

SUMMARY OF THE INVENTION

It is therefore, an object of the present invention to provide an improved organic light emitting display, and an improved process for manufacturing organic light emitting displays.

The present invention, therefore, solves problems associated with contemporary practice in the art by providing an organic light emitting display, in which a distance between a donor substrate laminated on an underlying base substrate and over a first electrode is minimized in the process of forming an organic layer pattern, thereby minimizing the energy of a laser beam requested to be supplied during transferring, as well as concomitantly improving efficiency and lifetime of the organic light emitting display being manufactured.

In an exemplary embodiment according to the principles of the present invention, an organic light emitting display includes a substrate formed with a thin film transistor. A planarization layer is formed on the entire surface of the substrate including the thin film transistor. A first electrode is formed in a predetermined region on the planarization layer and is connected to any one of the source and drain electrodes of the thin film transistor through a via hole formed in the planarization layer. A pixel defining layer is formed on the planarization layer and the first electrode, and is patterned to form an opening which exposes at least a part of the first electrode. An organic patterned layer is formed on the opening to the first electrode and both ends of the patterned pixel defining layer, and includes at least an emission layer. A second electrode is located on the organic layer pattern. The height of the pixel defining layer formed on the planarization layer in a region where the first electrode has not been formed is made to be lower than, or equal to, the height of the pixel defining layer formed on the first electrode. The pixel defining layer formed on the planarization layer in the region where the first electrode has not been formed may be created by the use of either a half tone mask or at least two masks. The pixel defining layer may be formed by dry etching.

The height of the first electrode may be formed to be higher than, or equal to, that of the planarization layer in the region where the first electrode will not be formed.

The height of the planarization layer in the region where the first electrode will not be formed may be made to be lower than, or equal to, that of the planarization layer in the region where the first electrode is formed. The planarization layer formed in the region where the first electrode will not be formed may be created with either a half tone mask or at least two masks. The planarization layer may be formed by dry etching.

A capacitor may be formed on a lower portion of the planarization layer in the region where the first electrode will not be formed.

The pixel defining layer maybe formed of either an organic or inorganic material, and may be formed of a material selected from a group consisting of a silicon oxide layer, a silicon nitride layer, and a silicon oxynitride layer.

The first electrode may be an anode, and the second electrode may be a cathode. Alternatively, the first electrode may be the cathode, and the second electrode may be the anode.

The organic light emitting display may be either a top or bottom emission type. In particular, in the case of a top emission type of light emitting display, preferably, the first electrode is an anode, and a reflective layer is formed on a lower portion of the anode.

The organic layer pattern may be either a single layer or a multi-layer pattern of at least two layers selected from a group consisting of an emission layer, a hole injection layer, a hole transport layer, an electron transport layer and an electron injection layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 3A is one cross-sectional view illustrating a donor substrate laminated on a substrate in the process of forming an organic layer pattern for an organic light emitting display constructed as a first embodiment of the present invention;

DETAILED DESCRIPTION OF THE INVENTION

Figure 1:
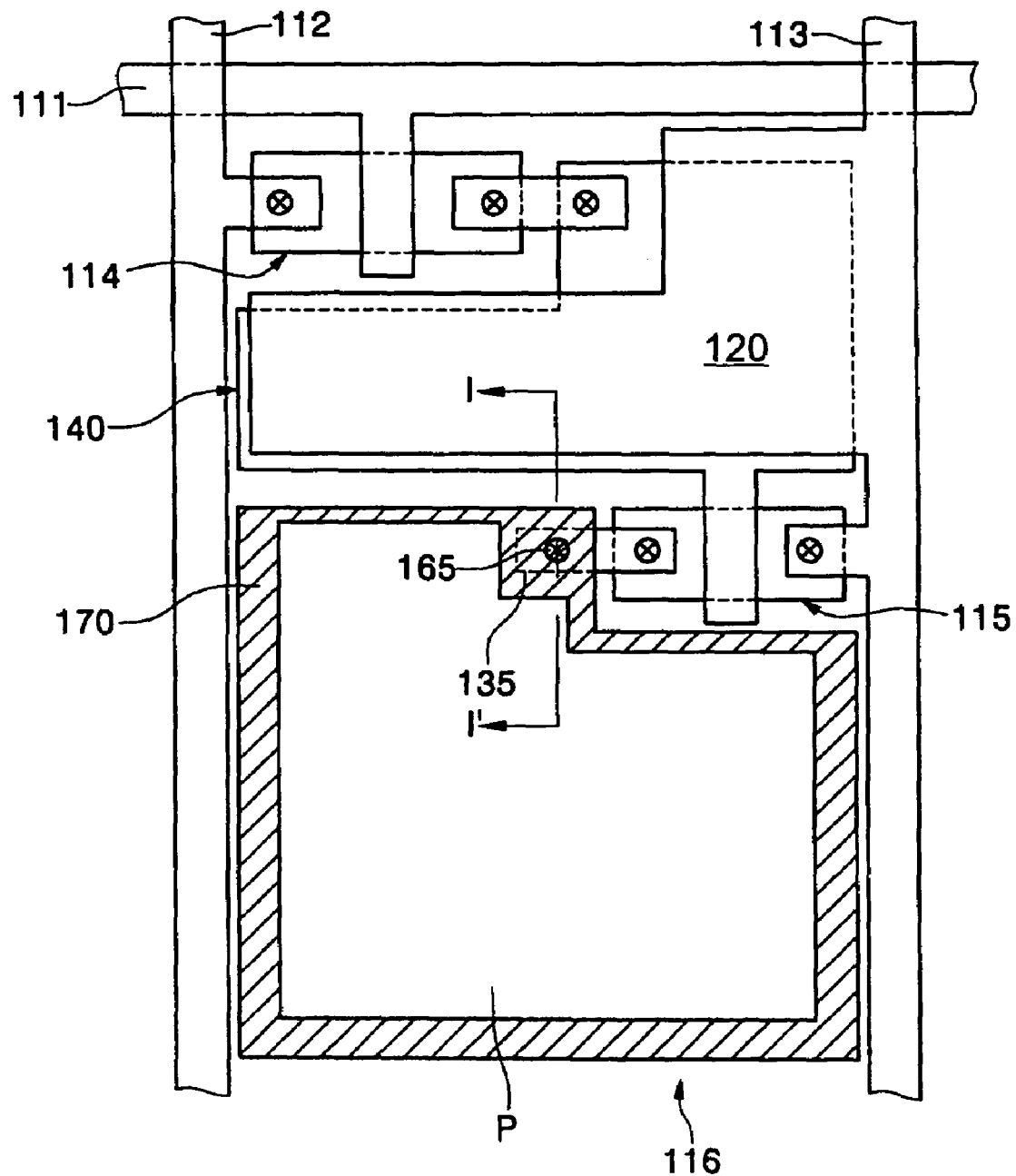
FIG. 1 is a layout of a unit pixel.

Turning now to the drawings and referring to FIG. 1, FIG. 1 is a layout of a unit pixel that includes a scan line 111 arrayed in one direction; a data line 112 intersecting scan line 111 and isolated from scan line 111; a common power line 113 intersecting scan line 111, isolated from scan line 111, and parallel to data line 112; a switching thin film transistor 114; a capacitor 140; a driving thin film transistor 115; and an organic light emitting diode 116. A region for the unit pixel is defined by intersection of scan line 111 and data line 112.

Switching thin film transistor 114 has a gate electrode and a source electrode respectively connected to scan line 111 and data line 112, thereby switching data signals applied to data line 112 by means of a scan signal applied to scan line 111.

Capacitor 140 has a lower electrode and an upper electrode 120 connected respectively to a drain electrode of switching thin film transistor 114 and common power line 113, thereby maintaining the data signal for a predetermined time period by charging a capacitor 140 to voltage corresponding to a difference between the data signal switched by switching thin film transistor 114 and a voltage applied to common power line 113.

Driving thin film transistor 115 has a gate electrode, a source electrode and a drain electrode 135 connected respectively to the lower electrode of capacitor 140, common power line 113 and organic light emitting diode 116, thereby supplying a current proportional in magnitude to the data signal maintained by capacitor 140 to organic light emitting diode 116. Organic light emitting diode 116 emits light in correspondence with the current supplied.

Organic light emitting diode 116 has a first electrode 170 connected electrically to driving thin film transistor 115, specifically to drain electrode 135 of driving thin film transistor 115, by means of via hole 165. First electrode 170 has an open region P capable of penetrating light.

Figure 2:
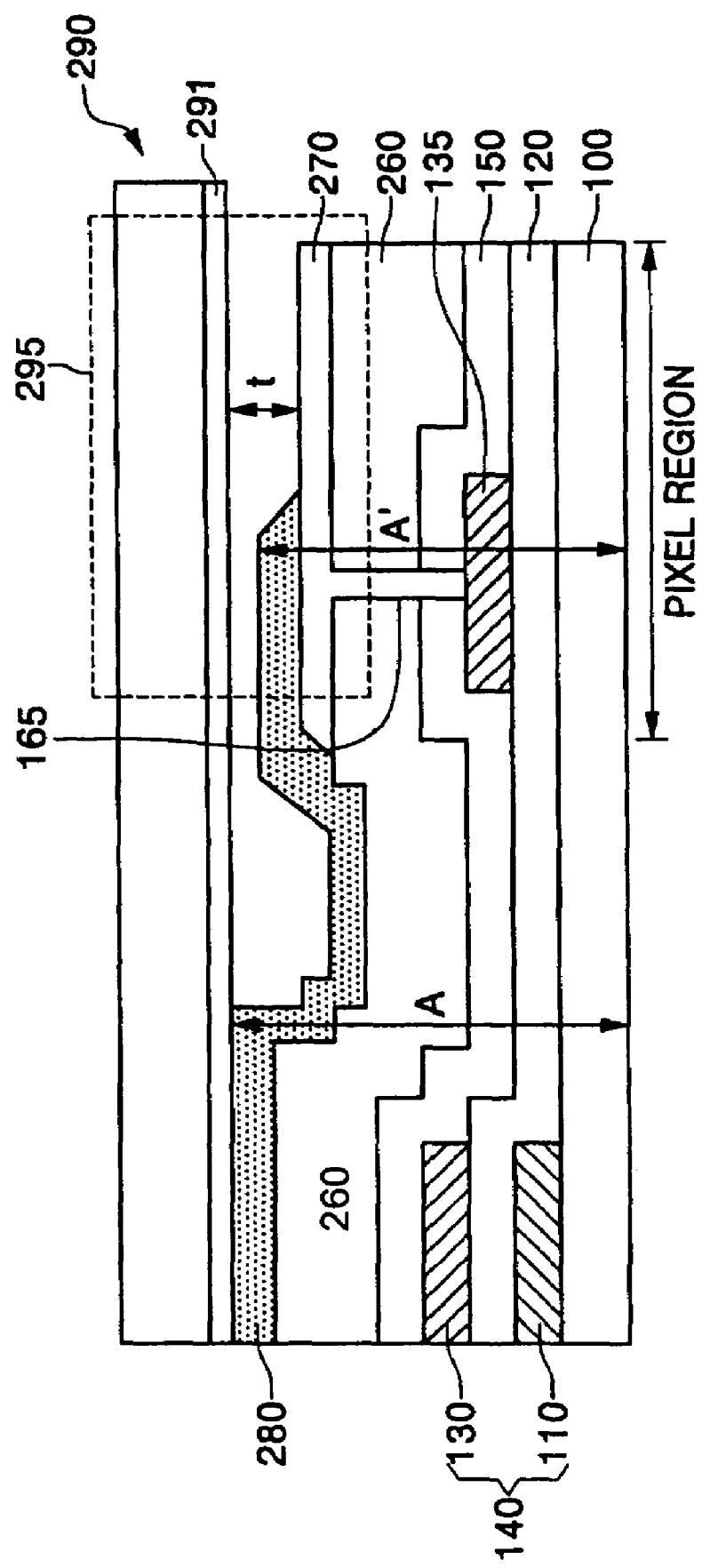
FIG. 2 is a cross-sectional view showing a donor substrate laminated on a substrate in the process of forming a pattern for an organic layer for an organic light emitting display.

FIG. 2 is a cross-sectional view showing a donor substrate laminated on a substrate in the process of forming a pattern for an organic layer of a conventional organic light emitting display. In the cross-sectional structure taken along the line I-I' of FIG. 1, a pixel region and a region other than the pixel region are shown. First, as to the pixel region, an interlayer insulating layer 120 is formed on a substrate 100. Drain electrode 135 of driving thin film transistor 115 is formed on interlayer insulating layer 120. A passivation layer 150 and a planarization layer 260 are sequentially formed on drain electrode 135. A first electrode 270 is formed on planarization layer 260, wherein the first electrode 270 is connected to drain electrode 135 through via hole 165 formed in planarization and passivation layers 260 and 150. A pixel defining layer 280 is formed on the first electrode 270 and an opening which exposes at least a part of the first electrode 270 is formed.

Looking at the region other than the pixel region, it can be seen that a gate metal 110, the interlayer insulating layer 120 and a source/drain metal layer 130 are sequentially formed on substrate 100, and that capacitor 140 is formed by the metal layers 110, 130 and insulating layer 120. Gate metal layer 110 serves as a lower electrode of capacitor 140, and source/drain metal layer 130 serves as an upper electrode of capacitor 140. Passivation layer 150 and planarization layer 260 are sequentially formed on capacitor 140, and pixel defining layer 280 is formed on planarization layer 260. At this time, it can be seen that the portion of planarization layer 260 in a region where first electrode 270 has not been formed, that is, that portion of planarization layer 260 which is shown in FIG. 2 to the left of first electrode 270, is formed at a height that is higher than the height of first electrode 270 formed on planarization layer 260. In order to cope with the presence of a step on substrate 100, planarization layer 260 is employed. Even so, it can be seen that a portion where common power line 113 is formed or a portion where capacitor 140 is formed has the greatest step.

An organic layer pattern is formed on pixel defining layer 280 and first electrode 270 using an LITI method, and thus a donor substrate 290 is laminated on substrate 100. Donor substrate 290 may be formed from a variety of layers such as a light-to-heat conversion layer and so forth, including a transfer layer 291 formed of an organic layer. At this point, since donor substrate 290 is brought into close contact with the highest region on the basis of substrate 100, donor substrate 290 is brought into closest contact with pixel defining layer 280 in the region where capacitor 140 is formed. Looking at a region 295 where a laser beam is applied to form the organic layer pattern, a distant distance t between donor substrate 290 and first electrode 270 and serious delamination cause a great deal of laser transfer energy to be required when transferring operation is performed.

Accordingly, we have discovered that the organic layer to be transferred may be damaged, so that the organic light emitting display may undergo a decrease in luminance efficiency and lifetime because the height A of pixel defining layer 280 in the region where first electrode 270 has not been formed is greater than the height A' of the pixel defining layer in the region where the first electrode 270 has been formed, and because the distance t between donor substrate 290 and first electrode 270 becomes more distant when donor substrate 290 is brought into close contact with pixel defining layer 280 in the region where the first electrode 270 has not been formed, compared to when donor substrate 290 is brought into close contact with pixel defining layer 280 in the region where first electrode 270 has been formed.

Hereinafter, the present invention will now be described in more detail with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those ordinarily skilled in the art. In the drawings, like numbers refer to like elements throughout the specification.

Figure 3B:
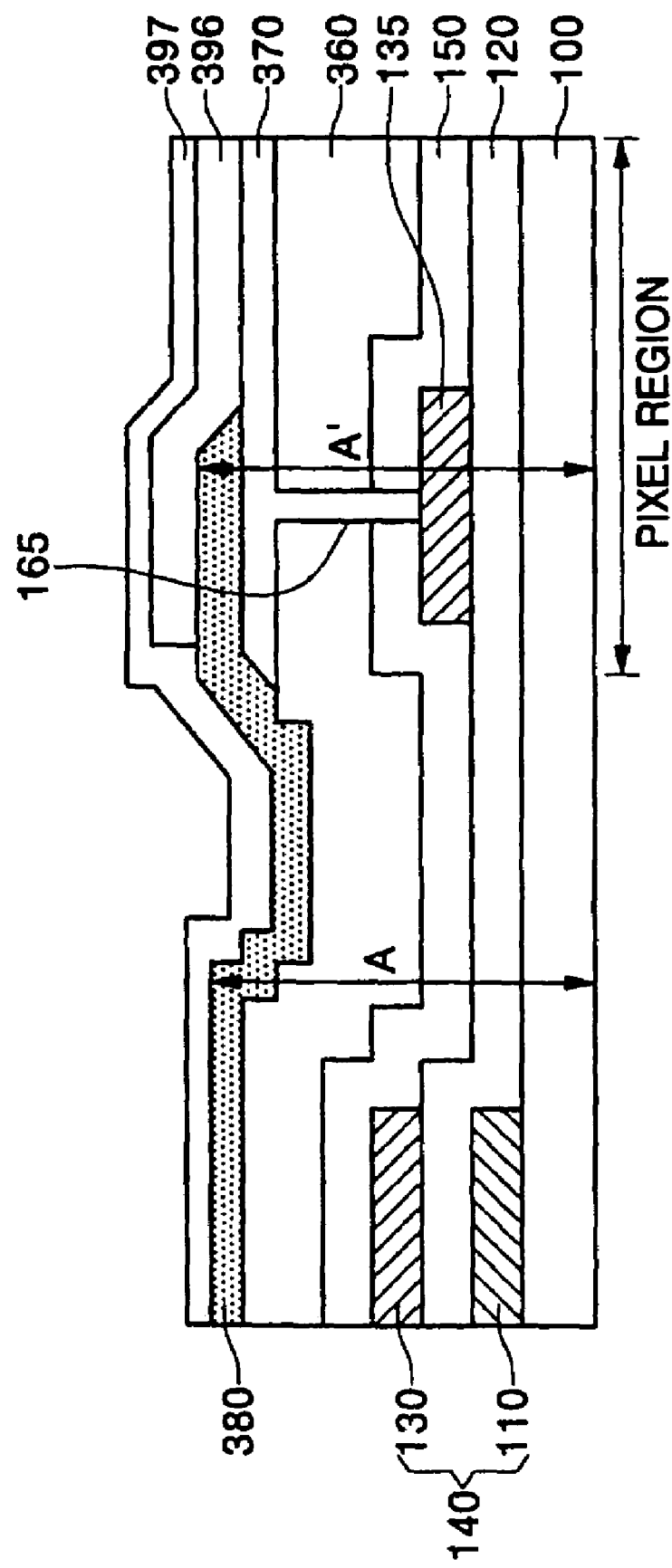
FIG. 3B is another cross-sectional view of an organic light emitting display constructed as a first embodiment of the present invention.

FIG. 3A is a cross-sectional view illustrating a donor substrate laminated on a substrate in the process of forming an organic layer pattern of an organic light emitting display according to a first embodiment of the present invention, and FIG. 3B is a cross-sectional view of an organic light emitting display according to a first embodiment of the present invention.

Referring to FIG. 3A, in the cross-sectional structure taken along the line I-I' of FIG. 1, a pixel region and a region other than the pixel region are shown. First, as to the pixel region, an interlayer insulating layer 120 is formed on a substrate 100. A drain electrode 135 of a driving thin film transistor is formed on the interlayer insulating layer 120. A passivation layer 150 and a planarization layer 360 are sequentially formed on the drain electrode 135. A first electrode 370 is formed on the planarization layer 360, wherein the first electrode 370 is connected to the drain electrode 135 through a via hole 165 formed in the planarization and passivation layers 360 and 150. A pixel defining layer 380 is formed on the first electrode 370 and an opening which exposes at least a part of the first electrode 370 is formed.

Looking at the region other than the pixel region, it can be seen that a gate metal 110, the interlayer insulating layer 120 and a source/drain metal 130 are sequentially formed on the substrate 100, and that a capacitor 140 is formed by the metals 110, 130 and the insulating layer 120. The gate metal 110 serves as a lower electrode of the capacitor 140, and the source/drain metal 130 serves as an upper electrode of the capacitor 140. The passivation layer 150 and the planarization layer 360 are sequentially formed on the capacitor 140, and the pixel defining layer 380 is formed on the plananzation layer 360.

The planarization layer 360 is formed to planarize the substrate where predetermined elements are formed. The planarization layer 360 is generally formed of an organic layer, and may make use of polyamide, benzocyclobutyl based resin, or polyacryl resin. However, although the planarization layer 360 is excellent in planarization performance, an uneven structure will be generated by a lower structure of the planarization layer 360. When the lower structure of the planarization layer 360 is highly formed, a height of the planarization layer 360 becomes high. Thus, the pixel defining layer is highly formed as well.

It can be seen from FIG. 3A that the planarization layer 360 in a region where the first electrode 370 is not formed is formed at a height higher than that of the first electrode 370 formed on the planarization layer 360. Although the planarization layer 360 is applied in the organic light emitting display that is used currently, it can be seen that either a portion where a common power line is formed or a portion where the capacitor 140 is formed has the highest step.

The pixel defining layer 380 is a layer for defining a pixel region, which is formed on the entire surface of the substrate having the first electrode and is patterned to form an opening exposing at least a part of the first electrode.

At this time, the pixel defining layer 380 may be patterned by a half tone mask. In other words, the half tone mask is used for the region where the first electrode is not formed, and any mask other than the half tone is used for the region where the first electrode is formed. Thereby, the height A of the pixel defining layer formed on the planarization layer 360 in the region where the first electrode 370 is not formed is equal to or lower than the height A' of the pixel defining layer in the region where the first electrode 370 is formed.

Alternatively, the pixel defining layer 380 may be formed using at least two masks. Specifically, the pixel defining layer 380 is patterned to form an opening on the first electrode 270 using the first mask, and then the pixel defining layer 380 formed in the region where the first electrode 370 is not formed is patterned using the second mask. In this case, the pixel defining layer 380 is patterned in such a manner that the height A of the pixel defining layer 380 formed in the region where the first electrode 370 has not been formed is lower than or at least equal to the height A' of the pixel defining layer 380 in the region where the first electrode 370 has been formed. Further, the pixel defining layer 380 formed in the region where the first electrode 370 has not been formed is patterned using two or more masks, so that its height can be lowered.

The pixel defining layer 380 may be formed by dry etching. To be more specific, after the pixel defining layer 380 is formed, the pixel defining layer 380 formed in the region where the first electrode 370 has not been formed is etched by the dry etching, so that its height can be formed to be lower than or at least equal to the height A' of the pixel defining layer 380 formed in the region where the first electrode 370 has been formed.

Therefore, although the planarization layer 360 formed in the region where the first electrode 370 will not be formed has a height higher than that of the first electrode 370 formed on the planarization layer 360, the height A of the pixel defining layer 380 formed in the region where the first electrode 370 is not formed, is formed to be lower than or at least equal to the height A' of the pixel defining layer 380 formed in the region where the first electrode 370 has been formed.

An organic layer pattern is formed on the first electrode 370 having the opening and on the pixel defining layer 380. The organic layer pattern may be formed by a transfer method employing a film, particularly by an LITI method In the process of forming the organic layer pattern using the LITI method, a donor substrate 390 having a transfer layer 391 is laminated on the substrate 100. Then, a laser beam is irradiated on a desired region of the donor substrate 390, so that the organic layer pattern is formed on the substrate.

At this time, looking at a region 395 where the organic layer pattern is formed by irradiation of the laser beam, it can be seen that a distance t between the donor substrate 390 and the first electrode 370 is decreased in comparison to devices manufactured according to contemporary practice, so that delamination is decreased. Therefore, when the organic layer pattern is formed, the transfer can be carried out by a low energy of laser beam, and it is possible to improve efficiency of the laser beam. Further, because of the low energy of the laser beam that is required for the transfer, it is possible to improve efficiency and lifetime of the organic light emitting display.

The pixel defining layer 380 may be formed of an organic material such as phenol resin, acryl, polyimide, or so forth.

Alternatively, the pixel defining layer 380 may be formed of an inorganic material, because the efficiency and lifetime of the organic light emitting display can be improved in inverse proportion to a height of a step of the pixel defining layer 380 in the process of applying the LITI method. In other words, the pixel defining layer 380 may be thinly formed by using an inorganic material such as silicon nitride, silicon oxynitride, or so forth.

Referring to FIG. 3B, it can be seen that the height A of the pixel defining layer 380 formed in the region where the first electrode 370 is not formed, is formed to be lower than or at least equal to the height A' of the pixel defining layer 380 formed in the region where the first electrode 370 is formed.

An organic layer pattern 396 is formed on the first electrode 370 having the opening and on the pixel defining layer 380. The organic layer pattern 396 includes at least an emission layer. Further, the organic layer pattern 396 is formed of a single layer consisting of the emission layer, or a multi-layer of at least two layers selected from a group consisting of a hole injection layer, a hole transport layer, an electron transport layer and an electron injection layer together with the emission layer.

A second electrode 397 is formed on the organic layer pattern 396. As a result, the organic light emitting display is completed.

The second electrode 397 is formed of a reflective electrode, i.e. a cathode using one selected from a group consisting of Mg, Ca, Al, Ag, and their alloys which are conductive metals having a low work function, when the first electrode 370 is an anode, i.e. a transparent electrode or a transparent electrode having a reflection layer at its lower layer. Alternatively, the second electrode 397 may be formed of a transparent electrode of ITO (indium tin oxide) or IZO (indium zinc oxide), i.e. an anode, when the first electrode 370 is a cathode.

The organic light emitting display may function as a top emission type or a bottom emission type. In the case of the top emission type, the first electrode 370 is generally formed of an anode electrode using a material having a high work function, and the reflective layer is formed on a lower portion of the anode. Thereby, light incident into the device is reflected. The reflective layer may be formed of one selected from a group consisting of Al, an Al alloy, Ag, and an Ag alloy, and preferably, of the Ag alloy.

Figure 4:
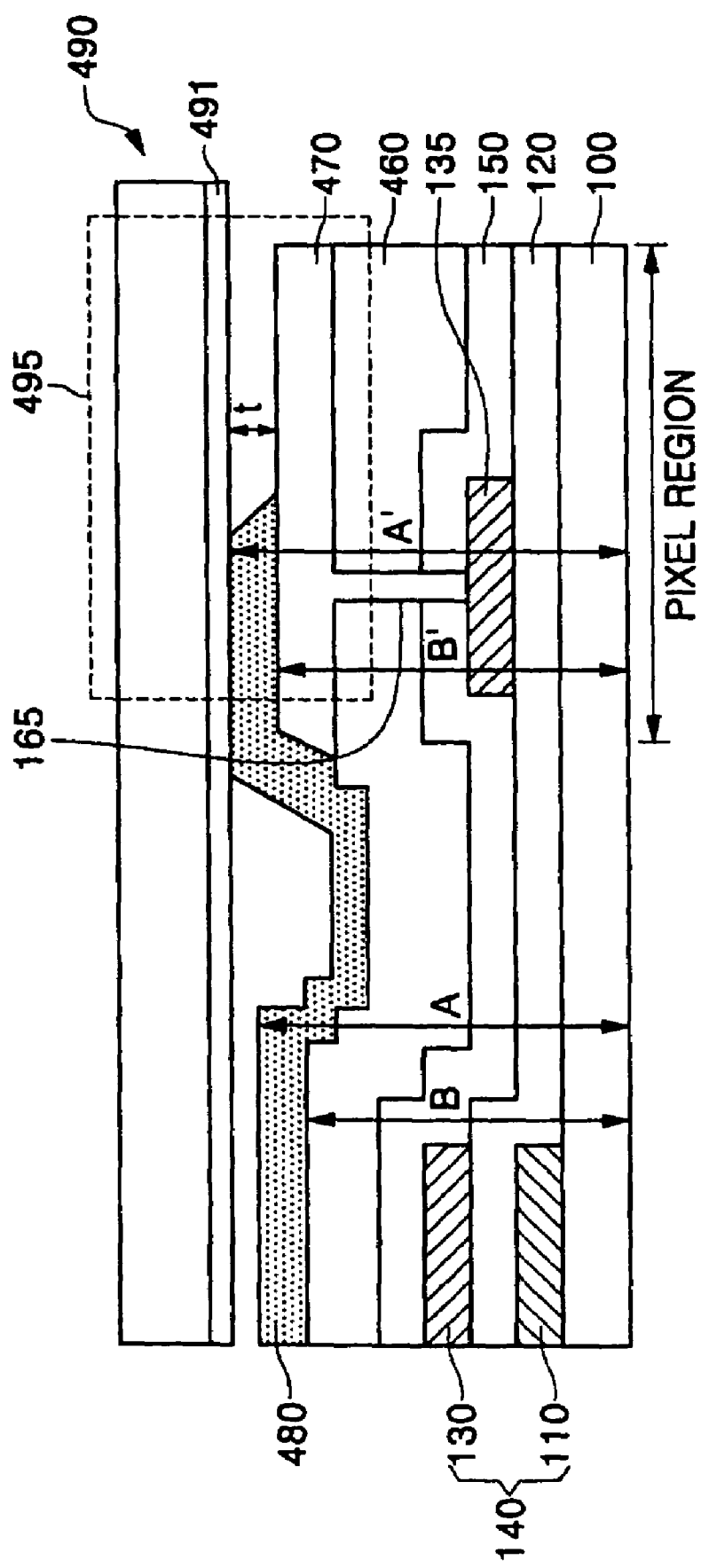
FIG. 4 is a cross-sectional view illustrating a donor substrate laminated on a substrate in the process of forming an organic layer pattern of an organic light emitting display constructed as a second embodiment of the present invention.

FIG. 4 is a cross-sectional view illustrating a donor substrate laminated on a substrate in the process of forming an organic layer pattern of an organic light emitting display according to a second embodiment of the present invention.

Referring to FIG. 4, in the cross-sectional structure taken along the line I-I' of FIG. 1, a pixel region and a region other than the pixel region are shown. A planarization layer 460 is formed on the entire surface of a substrate 100. A first electrode 470 is formed on the planarization layer 460. The first electrode 470 is connected to a drain electrode 135 of a driving transistor through a via hole 165 formed in the planarization layer 460.

The first electrode 470 may be an ITO layer or an IZO layer. The first electrode 470 may be formed by deposition using a sputtering method or an ion plating method, and preferably the sputtering method, and then selective patterning through wet etching using a photoresist (PR) patterned in a photolithography process as a mask.

At this time, the first electrode 470 is formed in such a manner that a height B' of the first electrode 470 formed on the planarization layer 460 is higher than, or at least equal to, a height B of the planarization layer 460 formed in a region where the first electrode 470 has not been formed.

A pixel defining layer 480 is formed on the first electrode 470 and the planarization layer 460. Since the height B' of the first electrode 470 formed on the planarization layer 460 is higher than, or at least equal to, the height B of the planarization layer 460 formed in the region where the first electrode 470 has not been formed, it can be seen that a height A of the pixel defining layer 480 formed in the region where the first electrode 470 is not formed is formed to be lower than or at least equal to a height A' of the pixel defining layer 480 formed in a region where the first electrode 470 is formed.

A donor substrate 490 having a transfer layer 491 is laminated on the substrate 100 having the first electrode 470 and the pixel defining layer 480.

At this time, looking at a region 495 where an organic layer pattern is formed by irradiation of a laser beam, it can be seen that a distance t between the donor substrate 490 and the first electrode 470 is decreased, and the resultant delamination is decreased.

Except for the foregoing description, the cross-sectional structure illustrating the donor substrate laminated on the substrate in the process of forming the organic layer pattern of the organic light emitting display according to the second embodiment of the present invention and the organic light emitting display according to the second embodiment of the present invention are identical to those of the first embodiment of the present invention.

Figure 5:
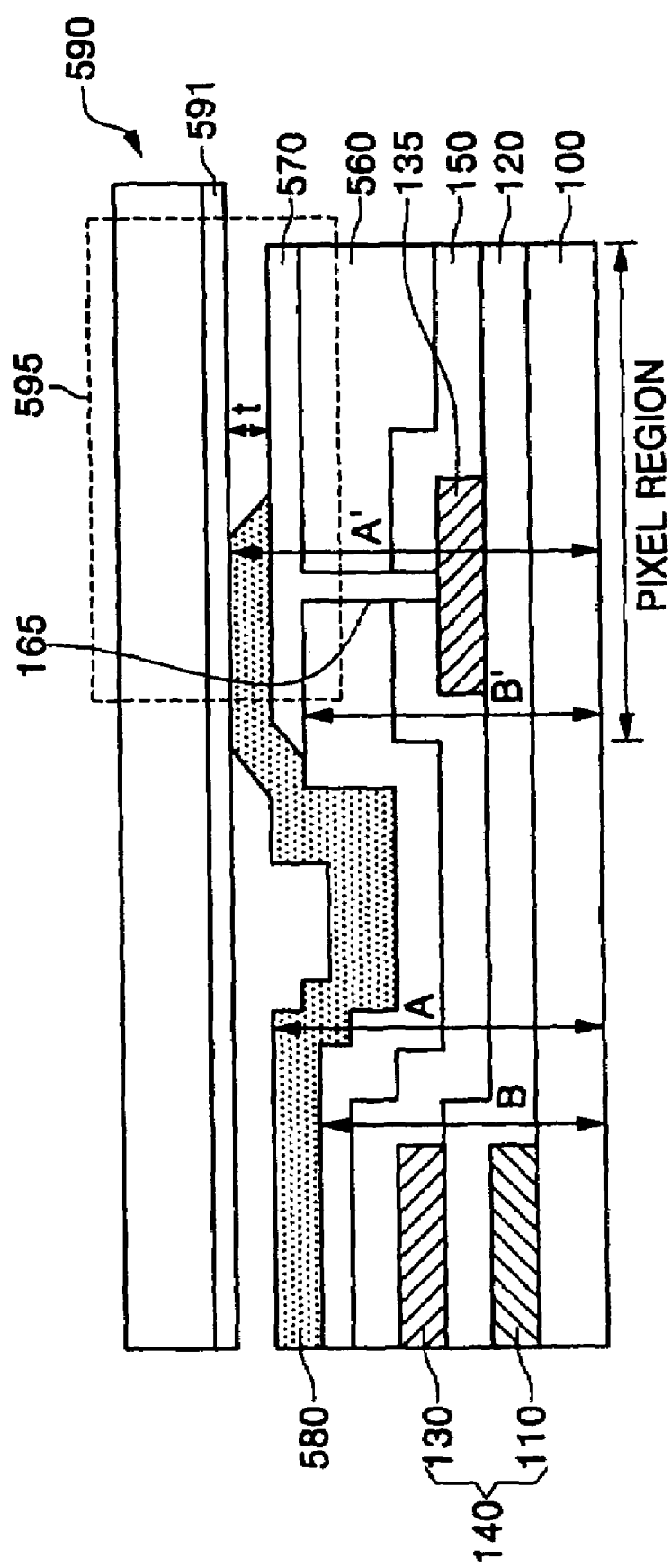
FIG. 5 is a cross-sectional view illustrating a donor substrate laminated on a substrate in the process of forming an organic layer pattern of an organic light emitting display constructed as a third embodiment of the present invention.

FIG. 5 is a cross-sectional view illustrating a donor substrate laminated on a substrate in the process of forming an organic light emitting display according to a third embodiment of the present invention.

Referring to FIG. 5, in the cross-sectional structure taken along the line I-I' of FIG. 1, a pixel region and a region other than the pixel region are shown. A passivation layer 150 is formed on the entire surface of a substrate 100 where predetermined elements are formed. A planarization layer 560 is formed on the passivation layer 150.

At this time, the planarization layer 560 may be patterned by a half tone mask. In other words, the half tone mask is used for a region where a first electrode 570 is not formed, and any mask other than the half tone is used for a region where the first electrode 570 is formed. Thereby, a height B of the planarization layer 560 in the region where the first electrode 570 will not be formed, is formed to be equal to or lower than a height B' of the planarization layer 560 in the region where the first electrode 570 will be formed.

Alternatively, the planarization layer 560 may be formed using at least two masks. Specifically, the planarization layer 560 is formed on the first electrode 570 using the first mask, and then the planarization layer 560 is formed such that the height B of the planarization layer 560 in the region where the first electrode 570 will not be formed is lower than or at least equal to the height B' of the planarization layer 560 in the region where the first electrode 570 will be formed, using the second mask. Further, the planarization layer 560 formed in the region where the first electrode 570 will not be formed is patterned using two or more masks, so that its height can be lowered.

The planarization layer 560 may be formed by dry etching. To be more specific, after the planarization layer 560 is formed, the planarization layer 560 formed in the region where the first electrode 570 is not formed is etched by the dry etching, so that the height B of the planarization layer 560 in the region where the first electrode 570 is not formed is lower than or at least equal to the height B' of the planarization layer 560 in the region where the first electrode 570 is formed A pixel defining layer 580 is formed on the first electrode 570 and the planarization layer 560, and then patterned to form an opening. A donor substrate 590 having a transfer layer 591 is laminated on the substrate 100 having first electrode 570 and the pixel defining layer 580.

Looking at a region 595 where an organic layer pattern is formed by irradiation of a laser beam, it can be seen that a distance t between the donor substrate 590 and the first electrode 570 is decreased and the resultant delamination is decreased.

Except for the foregoing description, the cross-sectional structure illustrating the donor substrate laminated on the substrate in the process of forming the organic layer pattern of the organic light emitting display according to the third embodiment of the present invention and the organic light emitting display according to the third embodiment of the present invention are identical to those of the first embodiment of the present invention.

According to the present invention as mentioned above, the height of the pixel defining layer formed on the planarization layer in the region where the first electrode is not formed is formed to be lower than or at least equal to the height of the pixel defining layer formed on the first electrode, so that in the process of forming the organic layer pattern, the distance between the donor substrate laminated on the substrate and the first electrode is minimized to allow the transfer to be carried out by the low energy of a laser beam. Further, it is possible to improve energy efficiency of the laser beam. And, since the supplied transfer energy is low, it is possible to improve efficiency and lifetime of the device.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display, comprising:
    a substrate;
    a thin film transistor formed on the substrate;
    a passivation layer formed over the thin film transistor;
    a planarization layer formed on an entire surface of the passivation layer;
    a first electrode formed in a predetermined region on the planarization layer and connected to any one of source and drain electrodes of the thin film transistor through a via hole formed in the planarization layer and the passivation layer;
    a pixel defining layer formed on the planarization layer and the first electrode, said pixel defining layer being patterned to form an opening exposing at least a part of the first electrode;
    an organic layer pattern formed on the opening of the first electrode and on both ends of the patterned pixel defining layer, said organic layer pattern including at least an emission layer; and
    a second electrode formed on the organic layer pattern;
    wherein a height of the pixel defining layer formed on the planarization layer in a region where the first electrode is not formed is not greater than a height of the pixel defining layer formed on the first electrode.

2. The organic light emitting display as claimed in claim 1, wherein the first electrode has a height which is not less than a height of the planarization layer in the region where the first electrode is not formed.

3. The organic light emitting display as claimed in claim 1, wherein the planarization layer in the region where the first electrode is not formed has a height which is not greater than a height of the planarization layer in a region where the first electrode is formed.

4. The organic light emitting display as claimed in claim 1, wherein a capacitor is formed on a lower portion of the planarization layer in the region where the first electrode is not formed.

5. The organic light emitting display as claimed in claim 1, wherein the pixel defining layer is formed of an organic material.

6. The organic light emitting display as claimed in claim 1, wherein the pixel defining layer is formed of an inorganic material.

7. The organic light emitting display as claimed in claim 6, wherein the pixel defining layer is formed of one of a silicon oxide layer, a silicon nitride layer, and a silicon oxynitride layer.

8. The organic light emitting display as claimed in claim 1, wherein the first electrode is an anode, and the second electrode is a cathode.

9. The organic light emitting display as claimed in claim 1, wherein the first electrode is a cathode, and the second electrode is an anode.

10. The organic light emitting display as claimed in claim 1, wherein the organic light emitting display is a top emission light emitting display.

11. The organic light emitting display as claimed in claim 10, wherein the first electrode is an anode, and a reflective layer is formed on a lower portion of the anode.

12. The organic light emitting display as claimed in claim 1, wherein the organic light emitting display is a bottom emission light emitting display.

13. The organic light emitting display as claimed in claim 1, wherein the organic layer pattern is one of a single layer and a multi-layer comprising at least two layers, said at least two layers being selected from a group consisting of an emission layer, a hole injection layer, a hole transport layer, an electron transport layer and an electron injection layer.

14. An organic light emitting display, comprising:
    a substrate formed with a thin film transistor;
    a passivation layer formed over the thin film transistor;
    a planarization layer formed over an entire surface of the substrate including the thin film transistor;
    a first electrode formed in a predetermined region on the planarization layer and connected to any one of source and drain electrodes of the thin film transistor through a via hole formed in the planarization layer and the passivation layer;
    a pixel defining layer formed on the planarization layer and the first electrode, said pixel defining layer being patterned to form an opening exposing at least a part of the first electrode; and
    an organic layer pattern formed on the opening of the first electrode and on both ends of the patterned pixel defining layer, said organic layer pattern including at least an emission layer;
    wherein the planarization layer in a region over which the first electrode is not formed has a height which is not greater than a height of the planarization layer in a region over which the first electrode is formed.

15. The organic light emitting display as claimed in claim 14, wherein the planarization layer in the region over which the first electrode is not formed has a height which is equal to a height of the planarization layer in the region over which the first electrode is formed.

16. The organic light emitting display as claimed in claim 14, further comprising a second electrode formed on the organic layer pattern.

* * * * *